United States Patent
Byars et al.

(10) Patent No.: US 10,092,984 B2
(45) Date of Patent: Oct. 9, 2018

(54) METHODS AND SYSTEMS FOR ALIGNING TOOLING ELEMENTS OF ULTRASONIC BONDING SYSTEMS

(71) Applicant: Orthodyne Electronics Corporation, Wilmington, DE (US)

(72) Inventors: Jonathan Michael Byars, Fountain Valley, CA (US); Garrett Leigh Wong, North Tustin, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 15/897,981

(22) Filed: Feb. 15, 2018

(65) Prior Publication Data

US 2018/0169803 A1 Jun. 21, 2018

Related U.S. Application Data

(60) Continuation of application No. 15/184,428, filed on Jun. 16, 2016, now Pat. No. 9,925,624, which is a (Continued)

(51) Int. Cl.
*B23K 37/00* (2006.01)
*B23K 37/04* (2006.01)
(Continued)

(52) U.S. Cl.
CPC .......... *B23K 37/0408* (2013.01); *B23K 20/10* (2013.01); *B23K 20/26* (2013.01);
(Continued)

(58) Field of Classification Search
CPC ....... H01L 2924/00; H01L 2924/00013; H01L 2224/85205; H01L 2224/78703; H01L 2224/75753; B23K 20/004; B23K 2201/40; B23K 1/0016; B23K 1/0008; B23K 20/26; B23K 37/04; B23K 3/08; G05B 2219/37559; G05B 19/401; G05B 19/4015

See application file for complete search history.

(56) References Cited

U.S. PATENT DOCUMENTS

| 5,197,652 A | 3/1993 | Yamazaki |
|---|---|---|
| 5,796,161 A | 8/1998 | Moon |

(Continued)

FOREIGN PATENT DOCUMENTS

| CN | 101055846 | 10/2007 |
|---|---|---|
| KR | 10-2005-0111484 | 11/2005 |

OTHER PUBLICATIONS

International Search Report for International Application No. PCT/US2011/066428 issued by the Korean Intellectual Property Office dated Aug. 22, 2012.

*Primary Examiner* — Erin B Saad

(57) ABSTRACT

A method of aligning a subject tooling element of a material handling system of an ultrasonic bonding system is provided. The method includes the steps of: a) providing an overlay defining a relative position of at least a portion of a reference tooling element; b) viewing an image of at least a portion of the subject tooling element combined with a corresponding portion of the overlay; and c) adjusting a position of at least a portion of the subject tooling element by referring to the overlay in the image.

19 Claims, 19 Drawing Sheets

Related U.S. Application Data division of application No. 13/884,419, filed as application No. PCT/US2011/066428 on Dec. 21, 2011, now Pat. No. 9,393,641.

(60) Provisional application No. 61/428,047, filed on Dec. 29, 2010.

(51) Int. Cl.
*H01L 23/00* (2006.01)
*B23K 20/26* (2006.01)
*B23K 20/10* (2006.01)
*G06T 7/70* (2017.01)

(52) U.S. Cl.
CPC ............... *G06T 7/70* (2017.01); *H01L 24/75* (2013.01); *H01L 24/83* (2013.01); *H01L 2224/32245* (2013.01); *H01L 2224/75343* (2013.01); *H01L 2224/75753* (2013.01); *H01L 2224/83* (2013.01)

(56) References Cited

U.S. PATENT DOCUMENTS

| | | | |
|---|---|---|---|
| 6,062,459 | A | 5/2000 | Sabyeying |
| 7,224,829 | B2 | 5/2007 | Enokido |
| 7,578,425 | B2 | 8/2009 | Kampschreur et al. |
| 7,591,408 | B2 | 9/2009 | Walther |
| 2001/0051000 | A1* | 12/2001 | Kim ................ H01L 22/20 |
| | | | 382/151 |
| 2002/0040921 | A1 | 4/2002 | Ball et al. |
| 2012/0104075 | A1 | 5/2012 | Kang et al. |
| 2012/0177302 | A1* | 7/2012 | Habuka ................ H04N 1/3876 |
| | | | 382/274 |

\* cited by examiner

METHODS AND SYSTEMS FOR ALIGNING TOOLING ELEMENTS OF ULTRASONIC BONDING SYSTEMS

CROSS-REFERENCE TO RELATED APPLICATIONS

This application is a continuation of application Ser. No. 15/184,428, filed Jun. 16, 2016, which is a divisional application of application Ser. No. 13/884,419, filed May 9, 2013, which claims the benefit of International PCT Application No. PCT/US2011/066428 filed Dec. 21, 2011, which claims the benefit of U.S. Provisional Application No. 61/428,047 filed on Dec. 29, 2010, the contents of both of which are incorporated herein by reference.

FIELD OF THE INVENTION

The present invention relates to ultrasonic bonding systems, and more particularly, to methods of aligning tooling elements of such systems.

BACKGROUND OF THE INVENTION

In the processing and packaging of semiconductor devices, ultrasonic bonding (e.g., wire bonding, ribbon bonding, etc.) continues to be a widely used method of providing electrical interconnection between two or more locations within a package (e.g., between a die pad of a semiconductor die and a lead of a leadframe). For example, wire bonding machines are used to form wire interconnections between respective locations to be electrically interconnected. In certain example ultrasonic bonding systems, an upper terminal end of a bonding tool is engaged in an ultrasonic transducer. The transducer vibrates the bonding tool resulting in bond formation between a portion of the wire and a bonding location (e.g., a bond pad, a lead of a leadframe, etc.).

During a wire or ribbon bonding operation the workpiece (e.g., a leadframe strip including a plurality of semiconductor die) is supported by a support structure (e.g., a support anvil, a heat block, etc.). The workpiece is indexed using a material handling system to position a portion of the workpiece (e.g., a column of semiconductor die) over the support structure. The workpiece is typically secured between the support structure and a clamping structure. In a specific example, the support structure raises the relevant portion of the workpiece above rails of the material handling system, and the clamping structure is lowered to secure the workpiece against the support structure. Such a clamping structure may include a plurality of clamping fingers for contacting various portions of the workpiece.

It is important that the support structure and clamping structure be properly positioned during bonding. The process of properly positioning the support structure and clamping structure can be difficult and time consuming, especially in applications where multiple clamping fingers are included in the clamping structure. An exemplary conventional method of aligning these structures includes use of mechanical dies/gauges specific to the workpiece. Such dies/gauges tend to be expensive to manufacture, and are limited to use by a single bonding system, and a single type of workpiece.

Thus, it would be desirable to provide improved systems and methods for aligning tooling elements of ultrasonic bonding systems.

SUMMARY OF THE INVENTION

According to an exemplary embodiment of the present invention, a method of aligning a subject tooling element of a material handling system of an ultrasonic bonding system is provided. The method includes the steps of: a) providing an overlay defining a relative position of at least a portion of a reference tooling element (e.g., a relative position "relative" to another location of a reference bonding system such as the a reference position of a reference material handling system); b) viewing an image of at least a portion of the subject tooling element combined with a corresponding portion of the overlay; and c) adjusting a position of at least a portion of the subject tooling element by referring to the overlay in the image. Examples of the subject tooling element include (1) a subject support structure configured to support a workpiece during an ultrasonic bonding operation, and (2) at least one clamp finger of the material handling system.

According to another exemplary embodiment of the present invention, a method of generating an overlay of at least a portion of a tooling element of a material handling system of an ultrasonic bonding system is provided. The method includes the steps of: (a) aligning at least the portion of the tooling element with respect to a workpiece; and (b) creating the overlay to include at least one marking identifying a position of at least the portion of the tooling element after step (a).

According to yet another exemplary embodiment of the present invention, an ultrasonic bonding system is provided (e.g., the ultrasonic bonding system shown in FIG. 8, etc.). The machine includes a support structure configured to support a workpiece during an ultrasonic bonding operation, and a clamp finger for securing a portion of the workpiece against the support structure during the ultrasonic bonding operation. The machine also includes an imaging system, and an overlay configured to be imaged by the imaging system in relation to at least one of the support structure and the clamp finger. These features (as well as other features of such a system) are shown and described in connection with the various figures provided herein.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

As used herein the term "overlay" is intended to refer to any marks or other indicia which may be viewed in connection with an optical image of a portion of an ultrasonic bonding machine. Exemplary overlays are computerized overlays described herein which include computerized markings on a display that may be viewed by an operator of an ultrasonic bonding machine and/or workpiece.

As used herein, the term "tooling element" is intended to refer to any portion of an ultrasonic bonding machine used to support, restrain, and/or contact a workpiece during a wire/ribbon bonding operation. An exemplary tooling element includes a support structure (e.g., an anvil) configured to support a workpiece (e.g., from below the workpiece) during an ultrasonic bonding operation. Another exemplary tooling element is a device clamp including clamping fingers for contacting and/or restraining portions of the workpiece (e.g., leadframe) during the wire/ribbon bonding operation.

Figure 1A:
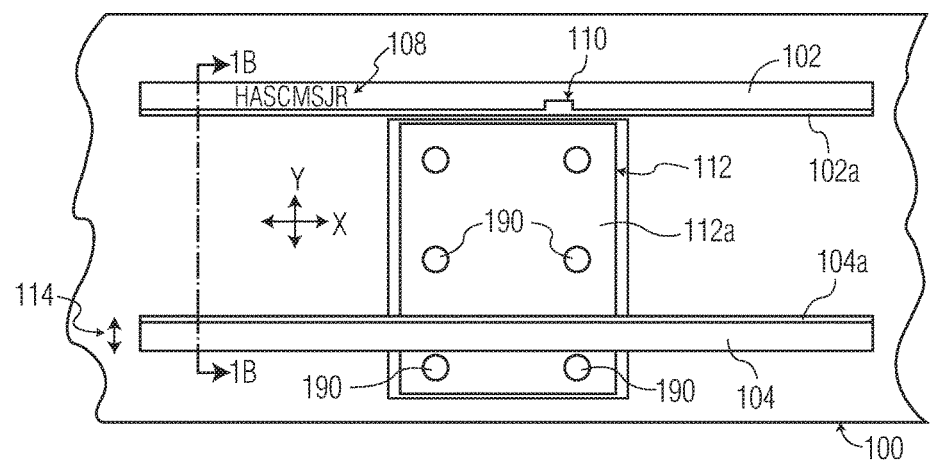
FIG. 1A is an overhead block diagram view of a portion of a material handling system of an ultrasonic bonding machine useful for explaining various exemplary embodiments of the present invention.
Figure 1B:
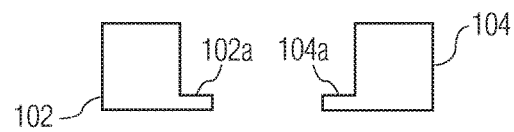
FIG. 1B is a cut away view of FIG. 1A taken along line 1B-1B.

FIGS. 1A-1B illustrate a portion of material handling system (MHS) 100 (sometimes referred to as a transport box) of an ultrasonic bonding machine (e.g., an ultrasonic wire bonding machine, or an ultrasonic ribbon bonding machine). Workpieces to be bonded (e.g., leadframes to be wire bonded) are moved along front and back rails 102, 104 of MHS 100 (e.g., using gripping members, pushing members, pulling members, etc.). MHS 100 also includes support structure riser (e.g., anvil riser) 112. Riser 112 is configured to raise and lower a support structure (e.g., an anvil), where the support structure supports a workpiece during a bonding operation. A position of front rail 104 may be adjusted (e.g., along the y-axis, see arrow 114) to accommodate varying sizes of workpieces. Riser 112 defines holes 190 which may be used to secure a support structure (e.g., an anvil) to top surface 112a of riser 112 (e.g., see anvil 220 in FIGS. 2A-2B).

As explained below, reference locations/positions may be identified on an MHS system. Exemplary locations on MHS 100 that may be used as such reference locations include (1) notch 110 in back rail 102, (2) indicia 108 on back rail 102 (e.g., a string of characters positioned on back rail 102), (3) one of holes 190, amongst other locations.

As more clearly illustrated in FIG. 1B (taken along line 1B-1B with some detail removed for simplicity), rails 102, 104 define respective lips 102a, 104a for supporting a workpiece (e.g., leadframe) during travel along MHS 100. Of course, other types of rails are contemplated.

Figure 2A:
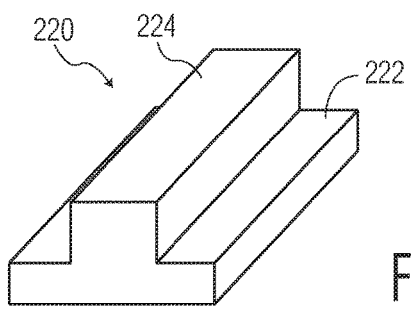
FIG. 2A is a perspective block diagram view of a support structure of a material handling system useful for explaining various exemplary embodiments of the present invention.
Figure 2B:
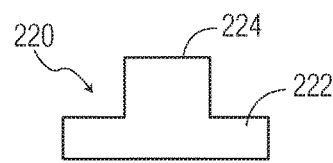
FIG. 2B is an end view of FIG. 2A.

FIGS. 2A-2B illustrate support structure 220 (e.g., anvil 220) configured to be carried by riser 112. During a bonding operation, anvil 220 supports a portion of a workpiece. Anvil 220 includes a lower base 222, and an upper face 224 for supporting the workpiece.

Figure 3A:
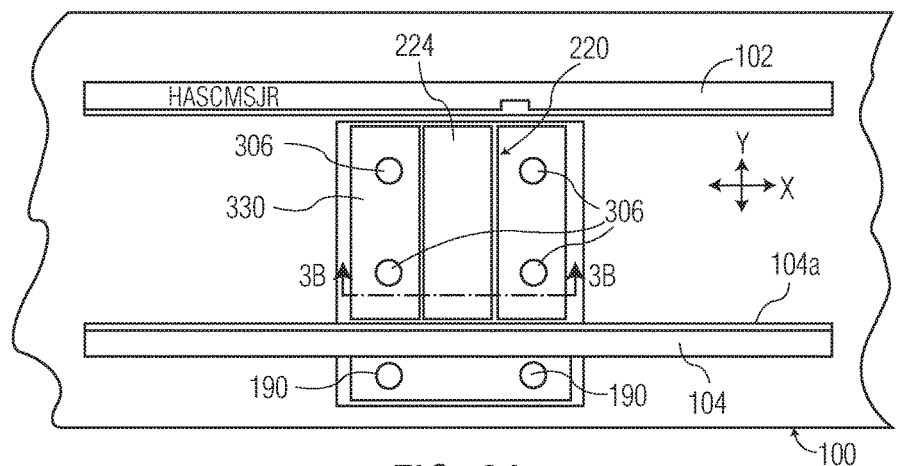
FIG. 3A is an overhead block diagram view of the material handling system of FIG. 1A, incorporating the support structure of FIGS. 2A-2B, useful for explaining various exemplary embodiments of the present invention.
Figure 3B:
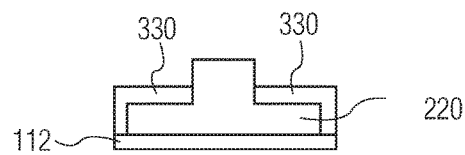
FIG. 3B is a cut away view of FIG. 3A taken along lines 3B-3B.

FIGS. 3A-3B are views of MHS 100 of FIG. 1 with support structure 220 secured to riser 112 by lockdown plates 330. Fasteners 306 are used to secure lockdown plates 330 to riser 112 through engagement with ones of holes 190. Of course, other support structure designs are contemplated.

Figure 4:
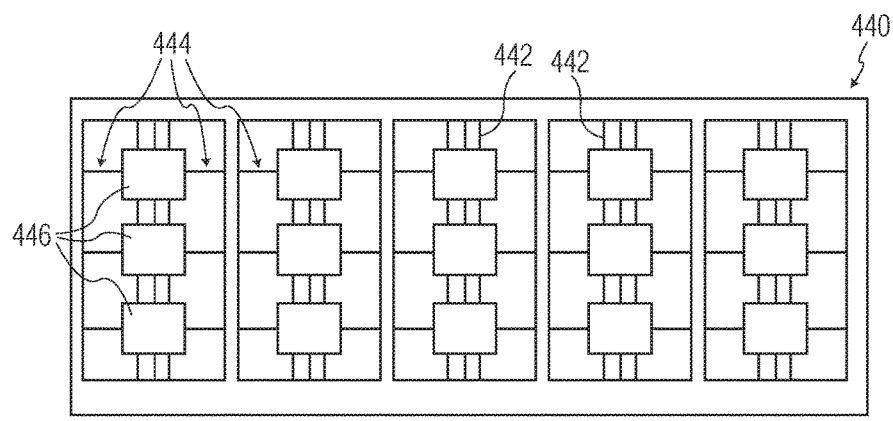
FIG. 4 is an overhead block diagram view of a leadframe useful for explaining various exemplary embodiments of the present invention.

FIG. 4 illustrates exemplary leadframe 440 that is indexed using MHS 100 of the ultrasonic bonding machine. Leadframe 440 includes a plurality of die 446 separated by, and connected by, tie bars 444 and leads 442.

Figure 5A:
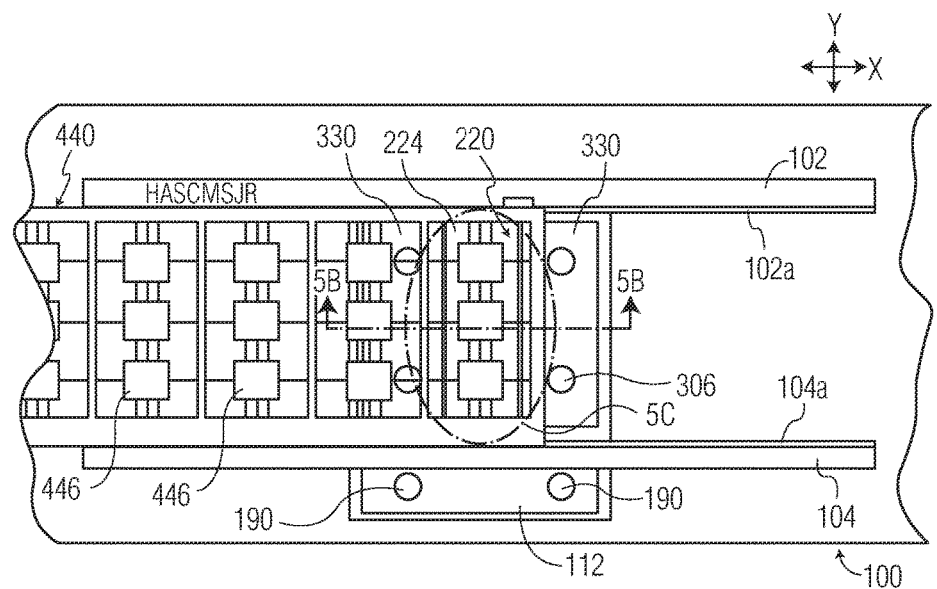
FIG. 5A is an overhead block diagram view of a material handling system of FIG. 3A including the leadframe of FIG. 4, useful for explaining various exemplary embodiments of the present invention.
Figure 5B:
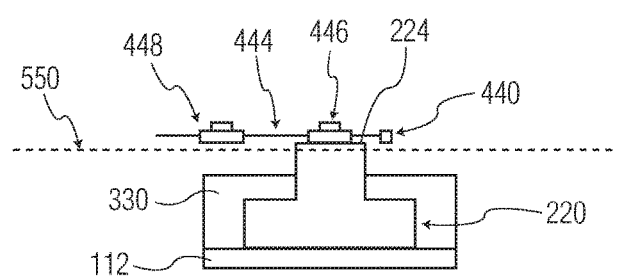
FIG. 5B is a cut away view of FIG. 5A taken along lines 5B-5B.

FIGS. 5A-5B illustrates MHS 100 shown in FIG. 3A (including support structure 220), with leadframe 440 indexed to a position over anvil face 224 for bonding. Leadframe 440 is positioned against a benching edge of back rail 102 to fix its position with respect to back rail 102 along the y-axis. Three semiconductor die 446 (arranged in a column) are shown positioned over face 224 of anvil 220. As more clearly seen in FIG. 5B, anvil riser 112 has been raised (e.g., using a cam system or other motion system) such that anvil face 224 is above plane 550 defined by rail lips 102a, 104A. In this position, anvil 220 supports the three die 446 (each supported by respective heat sink 448) within portion 5C of FIG. 5A, and a clamping structure (e.g., a device clamp including clamping fingers as described below) may be lowered to secure that portion of leadframe 440 against anvil 220.

Figure 5C:
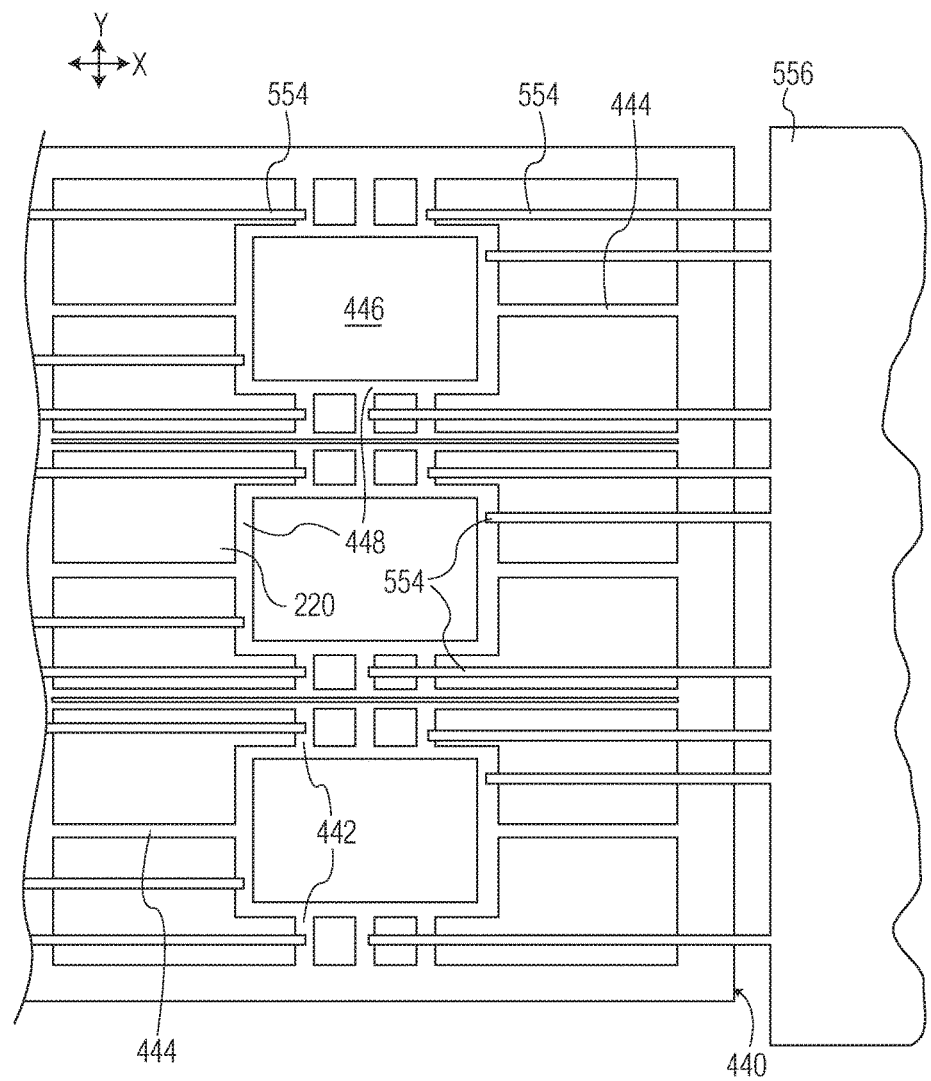
FIG. 5C is an enlarged block diagram view of portion 5C of FIG. 5A including additional features of the material handling system.

FIG. 5C illustrates portion 5C of FIG. 5A. Die 446 are supported by respective heat sinks 448 (e.g., where heat sinks 448 are portions of leadframe 440). Leads 442 and tie bars 444 connect to heat sink 448. Device clamp 556 has been positioned over leadframe 440 so that clamping fingers 554 of device clamp 556 contact various portions of leadframe 440 (e.g., leads 442, tie bars 444, etc.) to secure leadframe 440 against anvil 220. Thus, FIG. 5C may be considered a desirable set up for the tooling element (i.e., the anvil and the clamping fingers are aligned in desirable positions with respect to an indexing position of the leadframe). It would be desirable if the set up of the elements shown in FIG. 5C could be replicated during future bonding operations of like workpieces on the same or different wire bonding machines. FIGS. 5D-5K illustrate exemplary techniques for generating an alignment overlay.

Figure 5D:
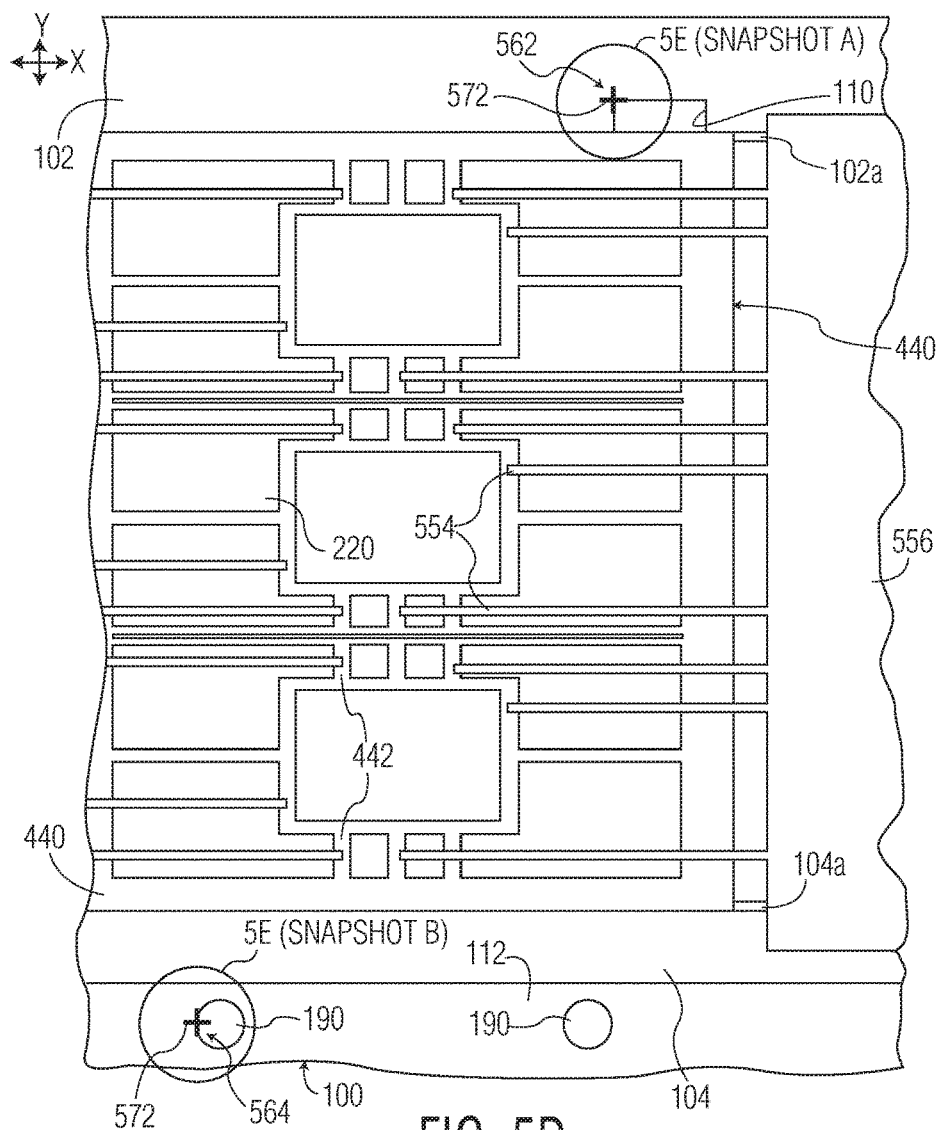
FIG. 5D is an enlarged block diagram view of portion 5C of FIG. 5A including additional features of the material handling system, and reference locations in accordance with an exemplary embodiment of the present invention.

FIG. 5D is similar to the view of FIG. 5C but also illustrates certain additional features of MHS 100 (including front rail 104, holes 190 of riser 112, and back rail 102 defining notch 110). In order to generate an alignment overlay of at least a portion of the tooling element (e.g., clamping fingers of a device clamp, a support structure such as an anvil, etc.), set-up software is initiated (e.g., Graphical Tooling Set-up Software). In accordance with the set-up software, at least one reference location/point is selected. For example, the reference location(s) may be: a location(s) of a portion(s) of a reference material handling system (e.g., such as MHS 100 shown in FIG. 5D); a location(s) of a portion(s) of a workpiece (e.g., areas of leadframe 440 shown in FIG. 5D); etc. In FIG. 5D, exemplary reference locations 562 and 564 have been selected as part of MHS 100. More specifically, first MHS reference location 562 is defined (e.g., by the user) as the upper left corner of notch 110 of back rail 102. Second MHS reference location 564 is defined as the left most point of left hole 190 in anvil riser 112.

Figure 5E:
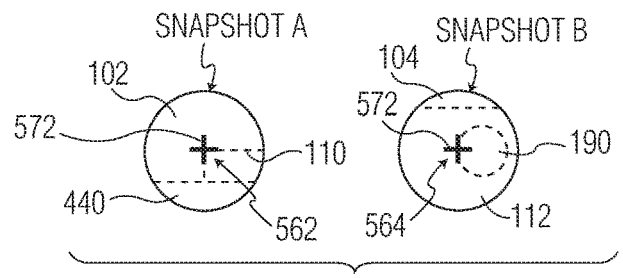
FIG. 5E is two enlarged portions 5E of FIG. 5D.

As illustrated in FIG. 5E (consisting of snapshot A, and snapshot B), an image snapshot is taken of each defined MHS reference location 562, 564 at portions 5E of FIG. 5D (e.g., snapshot A, snapshot B). For example, snapshots A and B are taken by the imaging system of MHS 100. This imaging system may be the same imaging system used during the bonding operation for tasks such as pattern recognition operations, teaching operations, etc. (or may be a distinct imaging system). Snapshots A (i.e., of the corner of notch 110 of back rail 103) and B (i.e., the left most part of left hole 190) may be used later to locate the selected reference locations of a subject material handling system as described below. While a single reference location may be selected, in many applications it will be desirable to select at least two reference locations to more accurately align the overlay with a subject MHS (e.g., to avoid potential error introduced by rotation, etc.).

Figure 5F:
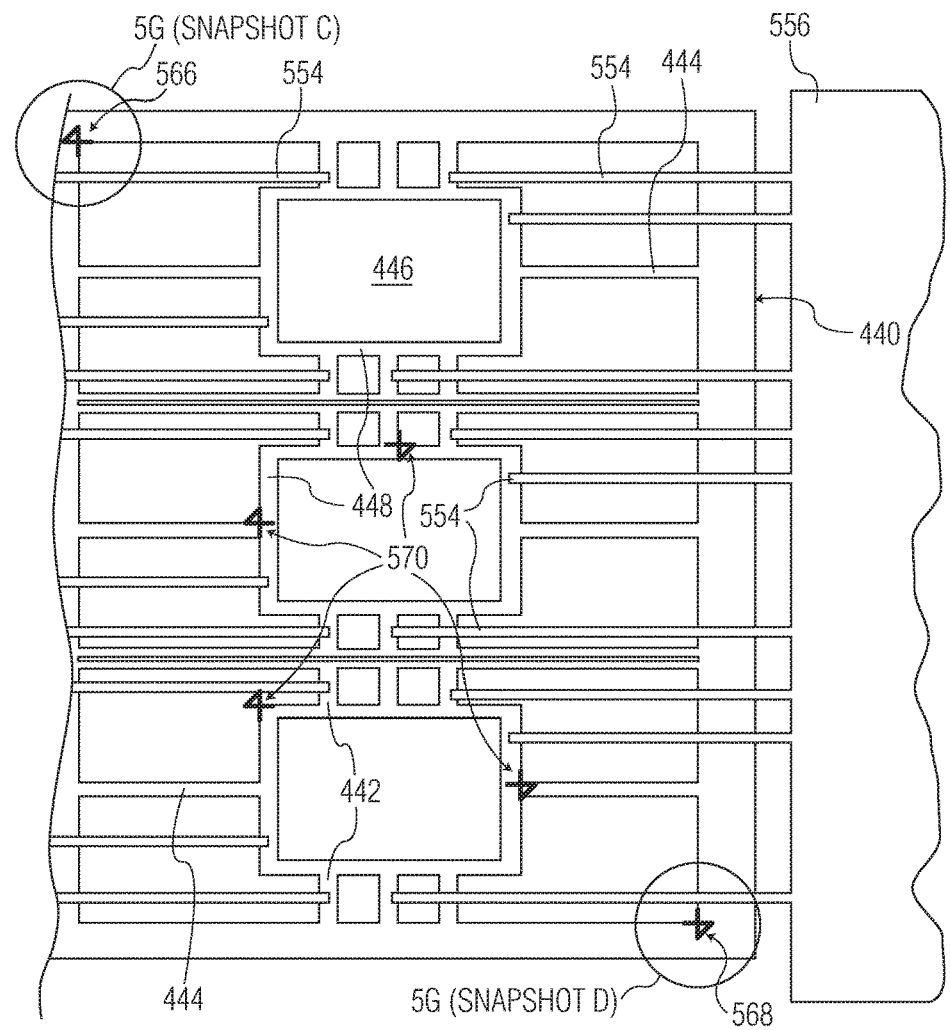
FIG. 5F is an enlarged block diagram view of portion 5C of FIG. 5A including additional features of the material handling system, and alternative reference locations in accordance with an exemplary embodiment of the present invention.
Figure 5G:
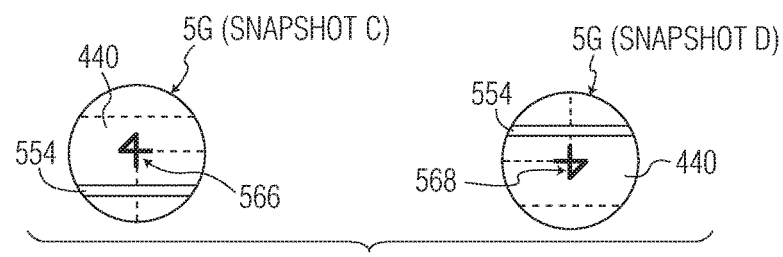
FIG. 5G is two enlarged portions 5G of FIG. 5F.

While FIG. 5D illustrates reference locations 562, 564 selected on MHS 100, other reference locations may be selected. For example, reference locations may be selected on a workpiece to be wire or ribbon bonded. Another non-limiting example would be to have one or more reference locations on each of the MHS and the workpiece. FIG. 5F illustrates an example where reference locations 566, 568 are selected on workpiece 440 (e.g., as portions of leadframe 440). Of course, other locations on a workpiece/leadframe may be selected. For example, FIG. 5F illustrates various optional reference locations 570. Images/snapshots C, D are taken of respective leadframe reference locations 566, 568 at portions 5G (e.g., see FIG. 5G illustrating enlarged views of snapshots C, D). If portions of a workpiece are selected as the reference locations, the workpiece (e.g., leadframe 440) may be positioned in a desired location for bonding such as in FIG. 5C, over support structure 220 and in relation to clamping fingers 554. In this position, reference locations 566, 568, 570 are selected (e.g., see FIG. 5F), and position markings may be defined for the overlay (as described below in connection with, e.g., FIGS. 5H-5I). Of course, if the overlay is to include position markings of the support structure (e.g., anvil 220) it may be useful to move the workpiece away from its bonding position such that the support structure is visible in order to define anvil position markings for the overlay.

Regardless of the source of the reference locations (e.g., the MHS, the workpiece, etc.), the user may select the reference locations by aligning the imaging system in a position above the selected location(s). For example, the user may move the imaging system (e.g., including a camera) along the XY coordinate system of the bonding machine using the XY table. When the imaging system is positioned above the selected reference location, the user specifies the selected reference location (e.g., such as inserting a symbol on the location, drawing one or more lines on or proximate to the reference location, etc.), and the user takes a snapshot of the selected reference location. The XY location of the reference location is now known, and is stored in memory. In a more specific example, the crosshairs of the lens of the imaging system may be aligned to intersect a point of the selected reference location. The XY position of such a crosshair (or equivalent structure) is known by the wire bonding machine and may be stored in memory as a snapshot. Referring back to FIGS. 5D-5E, crosshair 572 of the imaging system lens is aligned at the corner of notch 110 to define reference location 562. By selecting this as a reference location, the XY position of the corner of notch 110 of the reference MHS is known. Of course, while cross hair 572 is illustrated in two locations in FIG. 5D each of these locations refers to an image taken at a different time. After obtaining (e.g., and storing in memory) the XY locations of the reference locations, the user may then define the markings for the overlay in relation to the reference location(s) as will be described below with respect to, for example, FIGS. 5H-5J. In connection with the creation of the marking, the user may use certain drawing options such as line color, line weight, etc.

Figure 5H:
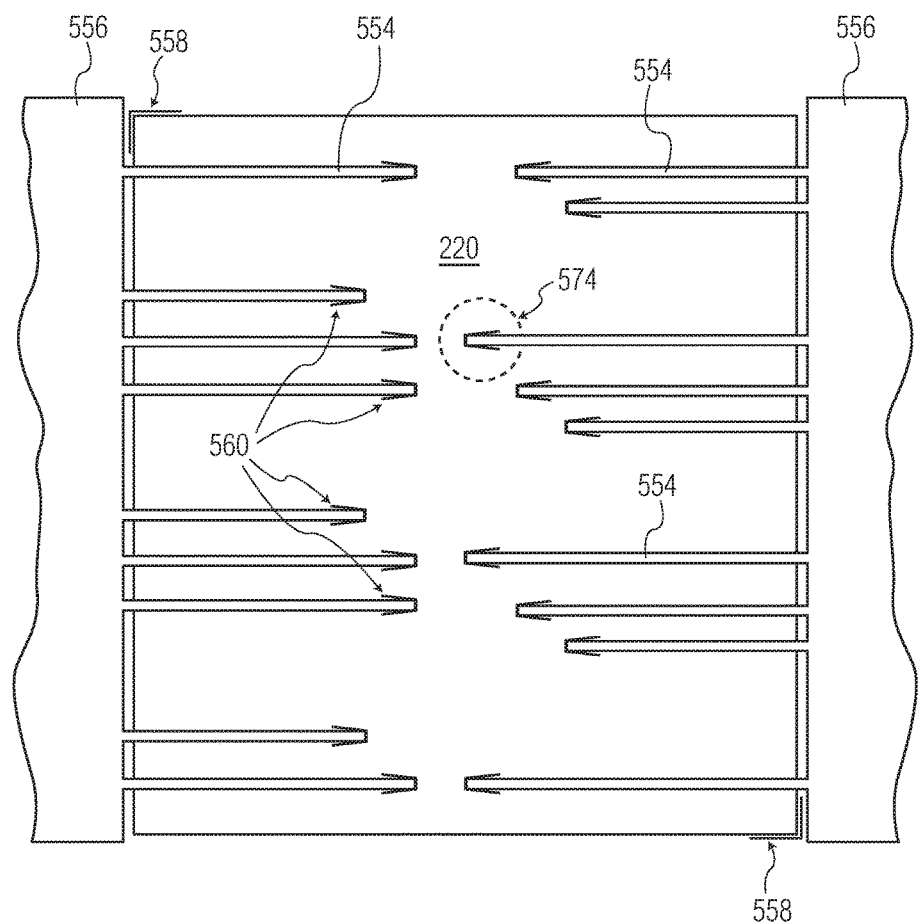
FIG. 5H is an overhead block diagram view of a graphical overlay including overlay markings superimposed on a portion of an ultrasonic bonding system in accordance with an exemplary embodiment of the present invention.

FIG. 5H illustrates a graphical overlay including overlay markings superimposed on a portion of an ultrasonic bonding system. More specifically, since the tooling element (e.g., clamping fingers 554 and anvil 220) are in their desired positions for bonding on the reference MHS/bonder, the user may now generate position markings for the overlay. That is, the user may position the imaging system to image portions of clamping fingers 554 in turn, and create graphical overlay finger markings 560 for each clamping finger 554. For example, the software may have predefined shapes (e.g., graphical markings 560 in FIG. 5H, cross shapes such as cross-shaped position markings 560' in FIG. 5I, tolerance shapes such as markings 560" in FIG. 5J, etc.) to identify the position markings. In another example, the software may allow the user to customize the shapes. Customized shapes may be drawn by the user line by line (or other markings such as boxes, arc shapes, etc.), to generate the desired customized shape. A specific example of a customized shape may be marking 560 that has a shape to approximate the outline of a portion of the tooling element such as clamp finger 554.

The user may generate the graphical position markings by a computer input mechanism (e.g., a computer mouse, track ball, touch screen, stylus, keyboard, etc.). When the computer input mechanism is linked to the XY position of the imaging system lens (e.g., camera lens), the XY position of each graphical marking is known. That is, after the graphical markings are created, their respective positions relative to the XY coordinate system of the MHS/bonder (and also their position relative to the reference locations) are known and may be stored in memory in connection with the graphical overlay. Referring again to FIG. 5H, the user has created (or otherwise provided) respective graphical markings 560 to mark the desired position of each clamping finger 554 in the MHS/bonder XY coordinate system. Further, the user has also created graphical anvil markings 558 to mark the desired position of portions of anvil 220. Collectively, these markings 558, 560 represent graphical overlay 580 shown in FIG. 5K (shown apart from tooling elements 220, 554 in FIG. 5J). That is, after overlay 580 is generated, it may be viewed in portions visible in field of view (FOV) 574 of the imaging system (and subject to scaling of the imaging system and similar functions). Specifically, graphical overlay 580 may be fixed with respect to the imaging system and does not move when the imaging system (e.g., a camera) is moved over the MHS/workpiece.

Figure 5I:
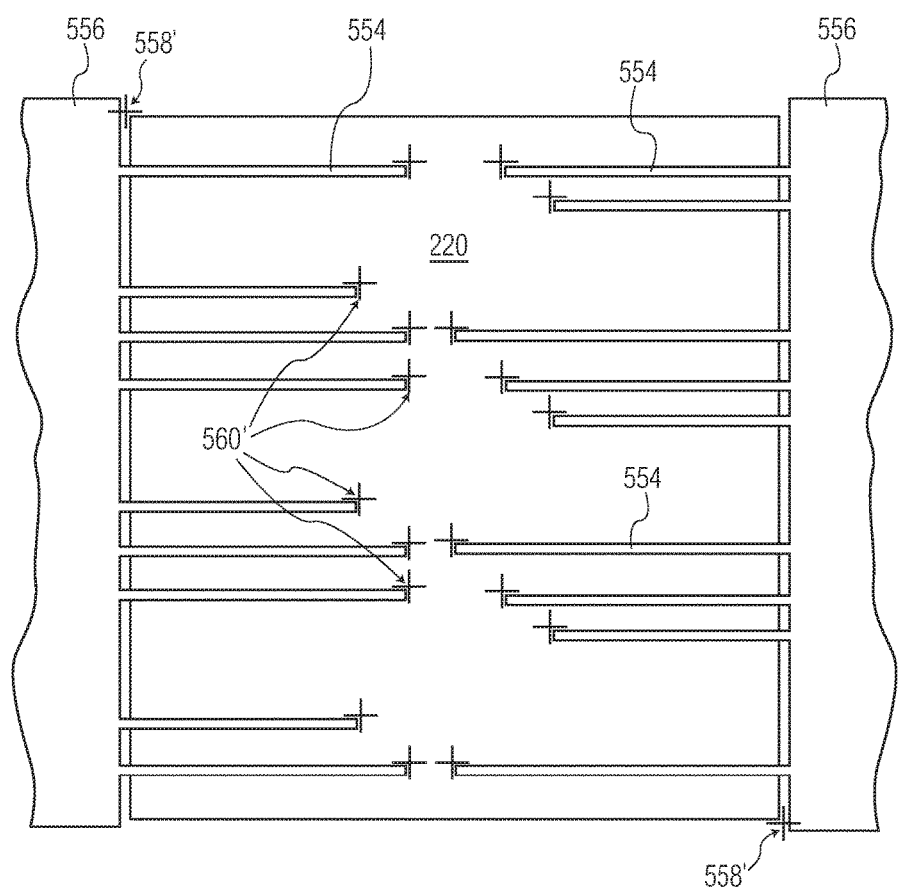
FIG. 5I is an overhead block diagram view of a graphical overlay including overlay markings superimposed on a portion of an ultrasonic bonding system in accordance with another exemplary embodiment of the present invention.

FIG. 5H illustrates an example where graphical markings 560, 558 are customized to approximate the outline of a portion of each clamp finger 554 and anvil 220; however, any type of marking may be selected as desired. For example, FIG. 5I illustrates cross-shaped graphical markings 560' to denote the positions of each clamp finger (and anvil 220). More specifically, graphical overlay clamping finger markings 560' define a corner configured for alignment with a portion of a respective end of clamping fingers 554, and graphical overlay anvil markings 558' define opposing corners configured for alignment with a respective portion of anvil 220.

Figure 5J:
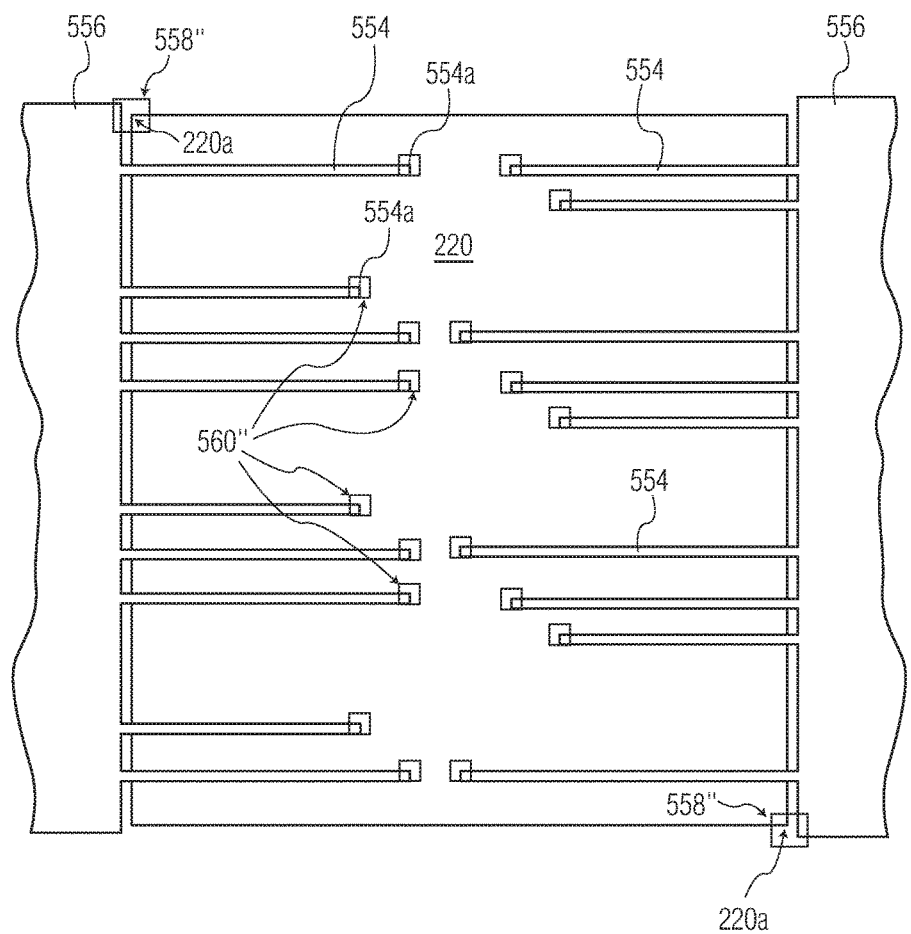
FIG. 5J is an overhead block diagram view of a graphical overlay including overlay tolerance field markings superimposed on a portion of an ultrasonic bonding system in accordance with another exemplary embodiment of the present invention.

FIG. 5J illustrates an example where graphical tolerance field markings 560" are provided (as opposed to the markings shown in FIGS. 5H-5I) such that when a predetermined portion of each clamp finger 554 falls within a respective tolerance field marking 560", they may be considered to be sufficiently aligned. For example, FIG. 5J illustrates square shaped graphical tolerance field markings 560", where each corner portion 554*a* has been aligned to be within a respective one of markings 560". Likewise, opposing corner points 220*a* of anvil 220 have been aligned within a respective one of tolerance markings 558". The size, shape and orientation of graphical tolerance field markings 560", 558" may be changed as desired. Exemplary variations include circle shaped tolerance markings, opposing lines defining a tolerance range (i.e., not a closed shape), amongst others.

Such graphical tolerance field markings 560", 558" may permit alignment of clamping fingers 554 and/or anvil 220 within such tolerance limits. That is, if an end portion of clamping finger 554 is within its respective graphical tolerance field marking 560", that clamping finger 554 may be deemed as aligned.

Figure 5K:
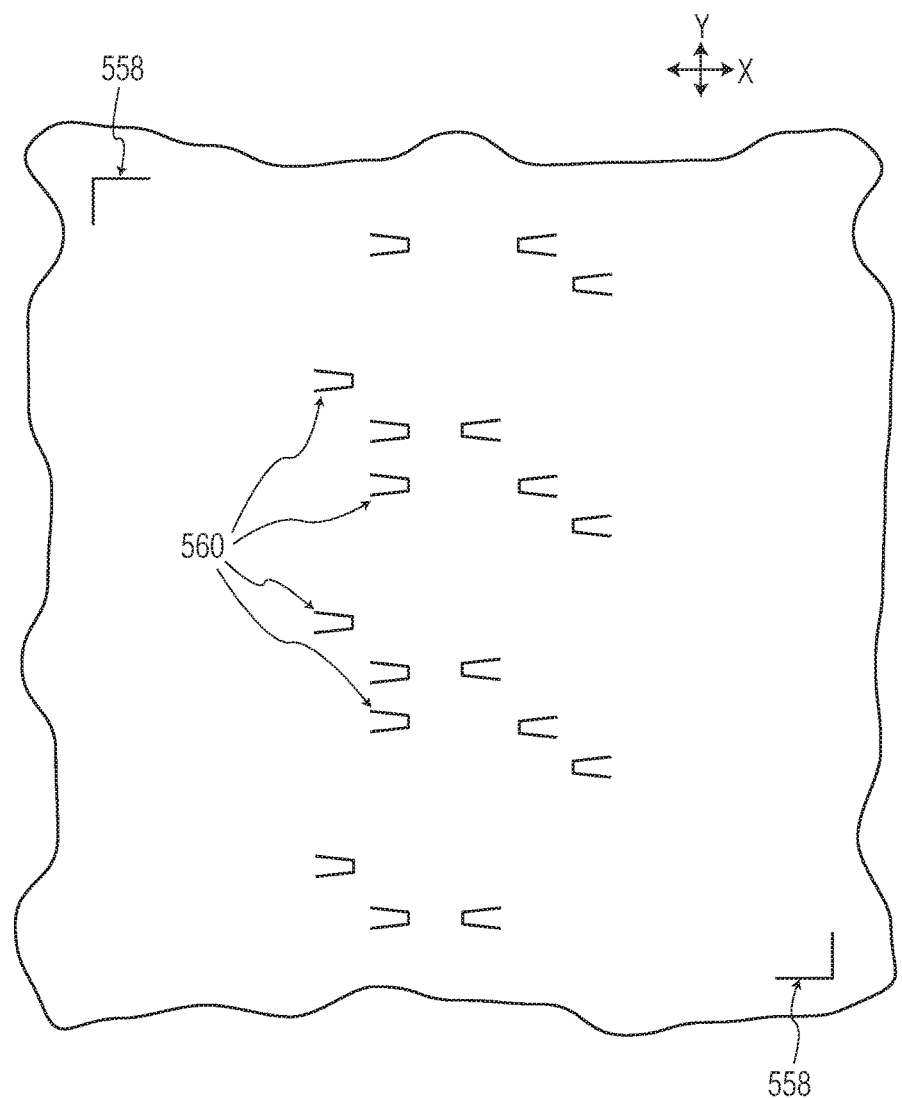
FIG. 5K is an overhead block diagram view of the graphical overlay of FIG. 5H in accordance with an exemplary embodiment of the present invention.

FIG. 5K illustrates an exemplary single viewable overlay 580 including graphical markings 558, 560 for tooling elements 220, 554 (e.g., see FIG. 5H). It may be desirable to divide overlay 580 into portions, or "layers", to simplify use of overlay 580 by a machine operator. One exemplary technique for dividing the portions of the tooling element (e.g., anvil 220, groups of clamping fingers 554, etc.) is based upon the height (e.g., along the z-axis) of each portion of the tooling element. In connection with such a technique, each layer of the overlay (corresponding to the heights of portions of the tooling element) may have a corresponding focus height setting of the imaging device (e.g., a height along the z-axis of the imaging device); that is, with the specific focus height setting for that layer, the corresponding portions 220, 554 of the tooling element are in focus. In one more specific example, the imaging device is moved along the z-axis (along with the bond head) to compensate for variations in heights of portions 220, 554 of the tooling element, thereby providing a consistent focal length.

Figure 6A:
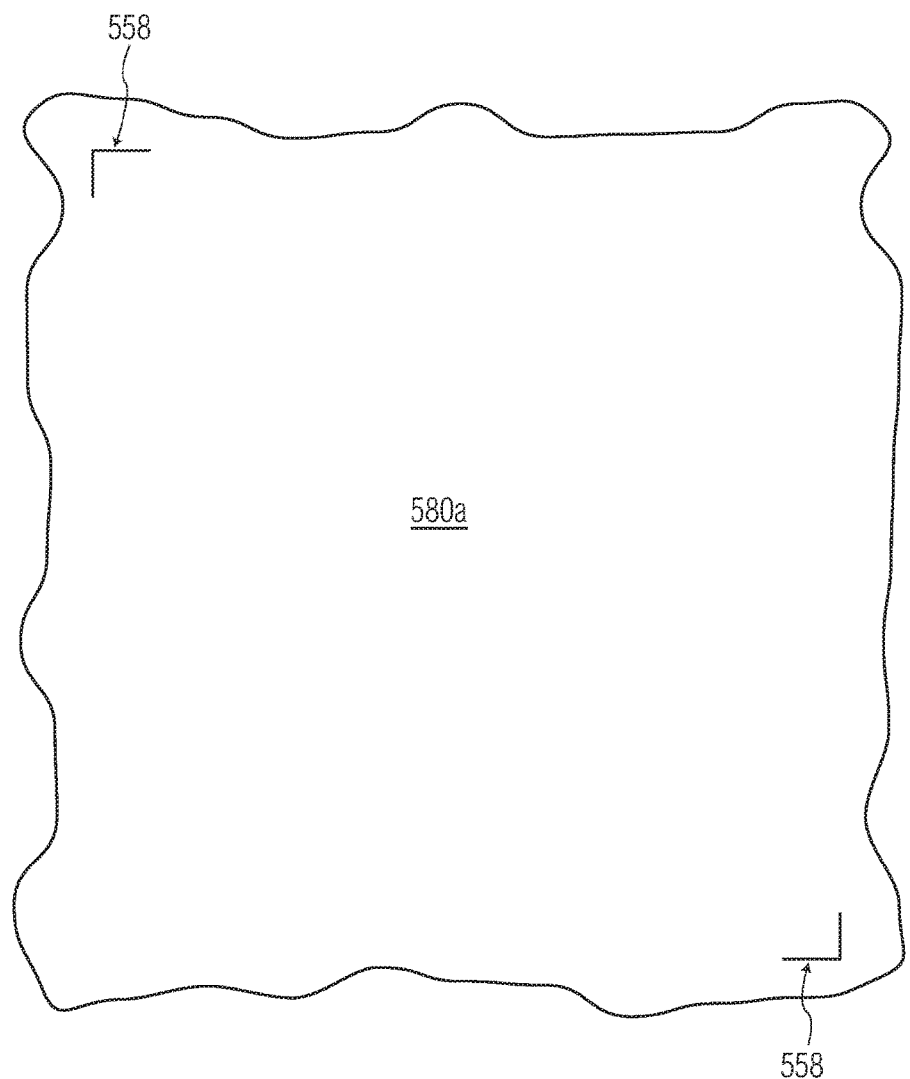
FIG. 6A-6D are block diagram views of multiple layers of the graphical overlay of FIG. 5H in accordance with an exemplary embodiment of the present invention.
Figure 6B:
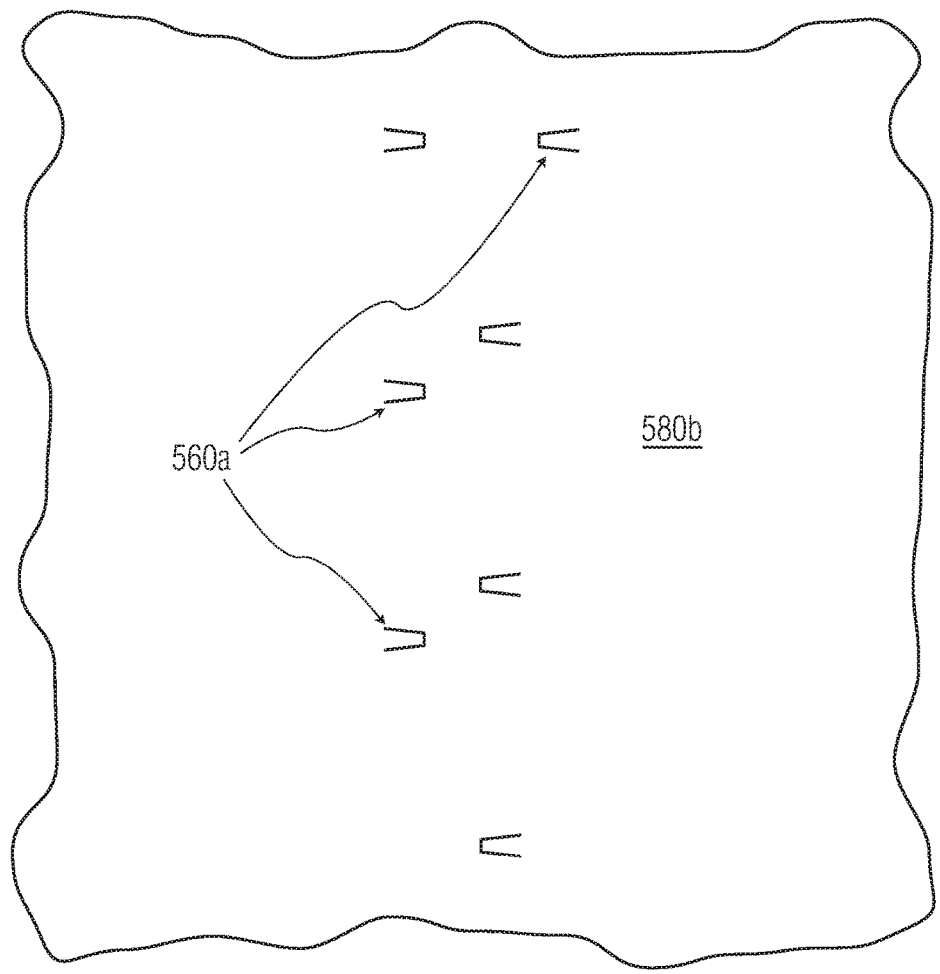
Figure 6C:
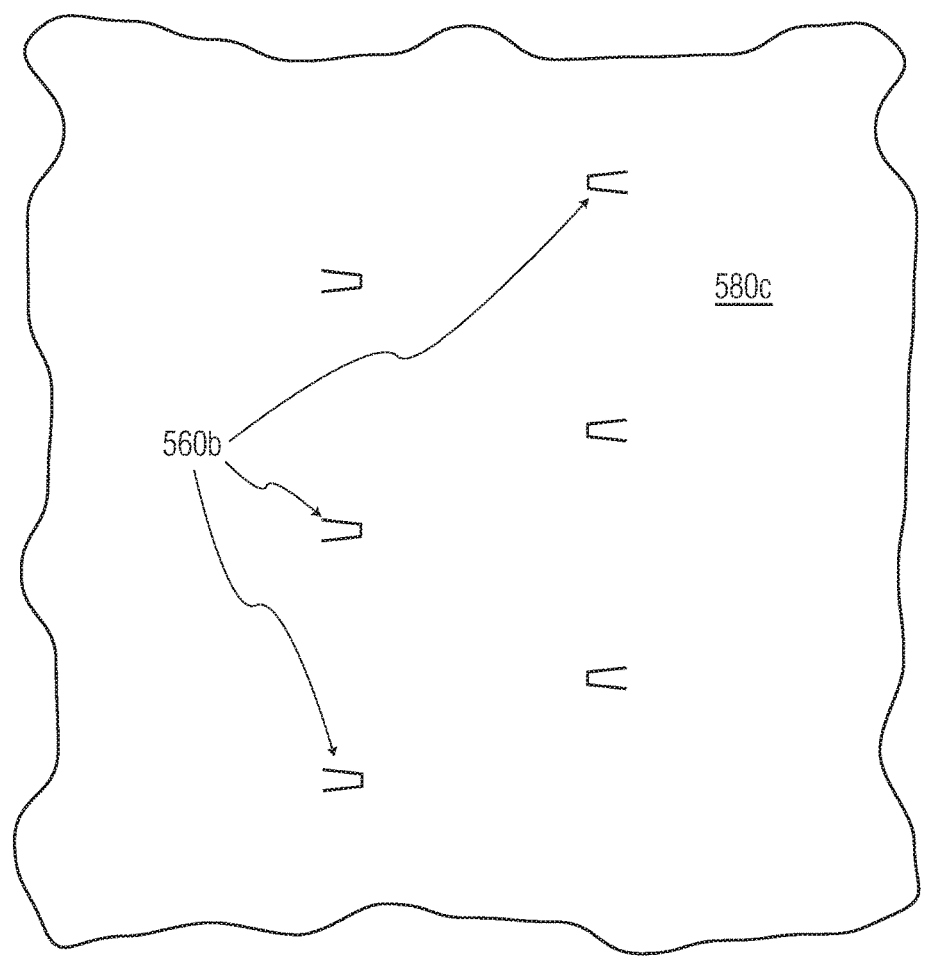
Figure 6D:
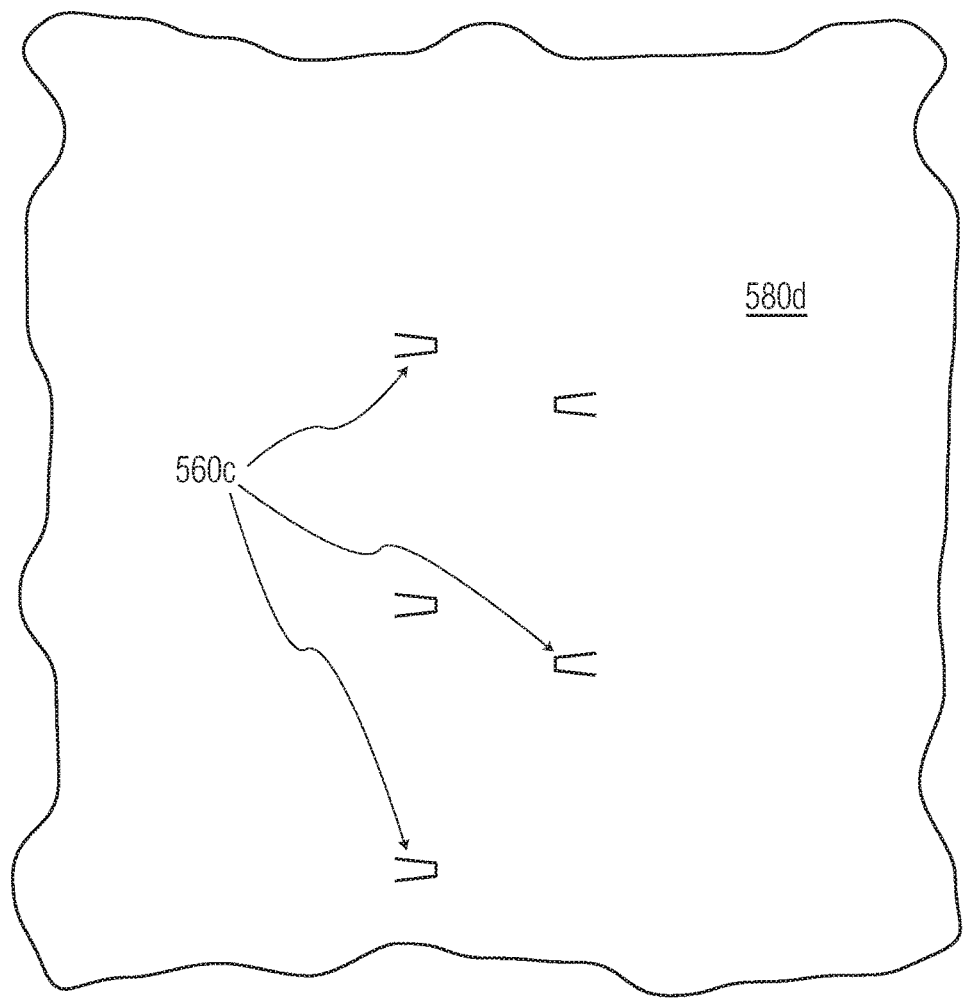

FIGS. 6A-6D illustrate an example where overlay 580 is provided as four distinct layers 580*a*, 580*b*, 580*c*, 580*d* (e.g., for different heights of the subject portions of the tooling element, where each layer/tooling portion height may have its own focus height setting of the imaging device). FIG. 6A illustrates a first (e.g., lowest) layer 580*a* of graphical overlay 580, and includes only graphical overlay anvil markings 558. FIG. 6B illustrates layer 580*b* (e.g., the next layer up from layer 580*a*) and includes the lowest level of graphical overlay clamping finger markings 560*a* corresponding to the lowest level of aligned clamping fingers 554 on leadframe 440. FIG. 6C illustrates layer 580*c* (e.g., the next layer up from layer 580*b*) and includes graphical overlay clamping finger markings 560*b* corresponding to the middle layer of aligned clamping fingers 554 on leadframe 440. FIG. 6D illustrates layer 580*d* (e.g., the next layer up from layer 580*c*) and includes graphical overlay clamping finger markings 560*c* corresponding to the uppermost level of aligned clamping fingers 554 on leadframe 440.

Regardless of whether the overlay is a single layer (e.g., overlay 580), or a plurality of layers (e.g., layers 580*a*, 580*b*, 580*c*, 580*d*), the overlay may now be stored in a memory of the ultrasonic bonding machine (or some other memory such as a portable memory device or networked memory), and may be otherwise electronically transmitted to another (e.g., remote) location for use in aligning the portions of the tooling element as described below.

As provided above, FIGS. 5D-5K illustrate exemplary techniques for generating overlays that may be a unitary overlay 580, or an overlay comprised of multiple overlay portions 580*a*-580*d*, that may each correspond to a different (focal) height of a tooling element. An exemplary use of graphic overlay 580 will now be described in connection with FIGS. 7A-7G. The user of overlay 580 may be the same user who generated overlay 580, or may be another user in a local or remote location. In any event, the software including the overlay is loaded into active memory of (or accessible by) the bonding machine on which it will be used to align the tooling element.

Figure 7A:
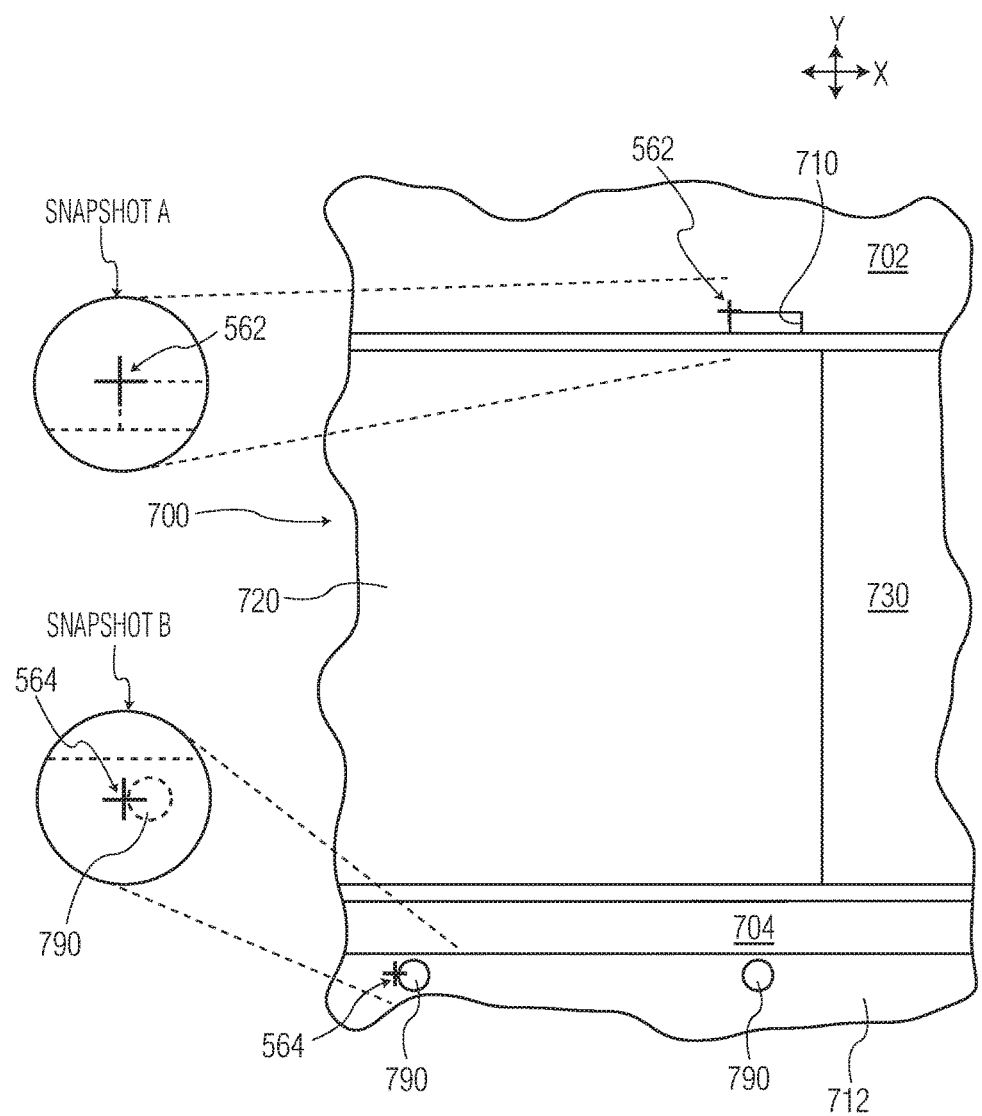
FIG. 7A is an overhead block diagram view of a portion of a material handling system illustrating reference locations and respective snapshots of those reference locations in accordance with an exemplary embodiment of the present invention.

FIG. 7A illustrates snapshots A and B which the user may view in order to identify the corresponding reference locations on the subject MHS. That is, it may be efficient to provide the user of subject MHS 700 with a view of the reference location(s) that were selected during generation of the overlay in order to identify the corresponding reference location(s) on subject MHS 700. In FIG. 7A (including anvil 720 and anvil lockdown plate 730), the user may use snapshot A to identify reference location 562, and may use snapshot B to identify reference location 564 of material handling system 700. After the upper left hand corner of notch 710 has been identified as corresponding to the reference location in snapshot A, the imaging device is positioned to align the imaging system (e.g., the cross hair of the lens of the imaging system) to notch 710 in back rail 702 as shown in FIG. 7A. By aligning the imaging system with notch 710 as shown in FIG. 7A, reference location 562 is established. The position of reference location 562 in the XY coordinate system of the subject MHS/bonder is now fixed (e.g., and saved to memory). This process may be repeated for any additional reference locations such as reference location 564 (e.g., the left side of left hole 790 in subject anvil riser 712 proximate front rail 704 as shown in FIG. 7A). After the position of the desired reference locations (e.g., 562 and 564) are fixed in (e.g., and saved to) the subject MHS/bonder, the overlay may be aligned to the subject MHS/bonder. For example, the XY position of each of the markings of the overlay may be adjusted by the software based on the XY offset of the reference locations from the reference MHS/bonder to the subject MHS/bonder. In any event, the markings of the overlay are now be available for viewing (e.g., on a display of the bonder) (and for aligning the portions of the tooling element) in connection with the subject MHS bonder.

While FIG. 7A is illustrated and described in connection with a manual process of locating and aligning the reference locations from the reference MHS/bonder to the subject MHS/bonder, the present invention is not limited thereto. That is, automated techniques may be used to locate and align the reference locations. In one example, pattern recognition techniques may be used to automatically align the reference location(s) and, if desired, to automatically generate the overlay based on the aligned reference location(s).

Figure 7B:
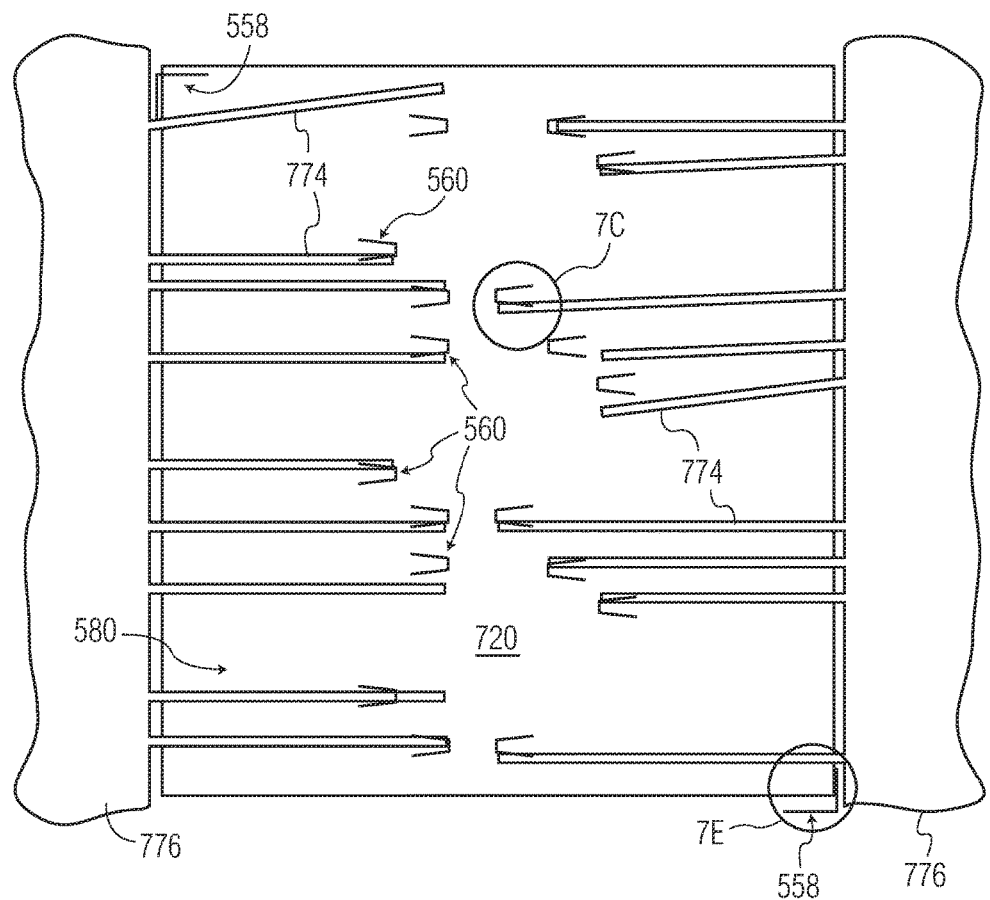
FIG. 7B is an overhead block diagram view of a graphical overlay superimposed upon tooling elements of a material handling system in accordance with an exemplary embodiment of the present invention.
Figure 7C:
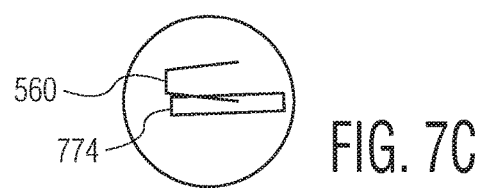
FIG. 7C is an enlarged view of portion 7C of FIG. 7B.
Figure 7D:
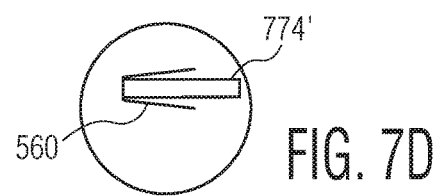
FIG. 7D is an enlarged view of portion 7D of FIG. 7G.
Figure 7E:
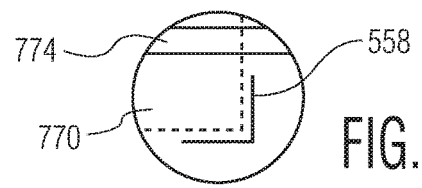
FIG. 7E is an enlarged view of portion 7E of FIG. 7B.
Figure 7F:
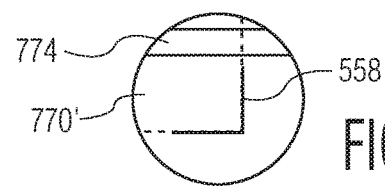
FIG. 7F is an enlarged view of portion 7F of FIG. 7G.
Figure 7G:
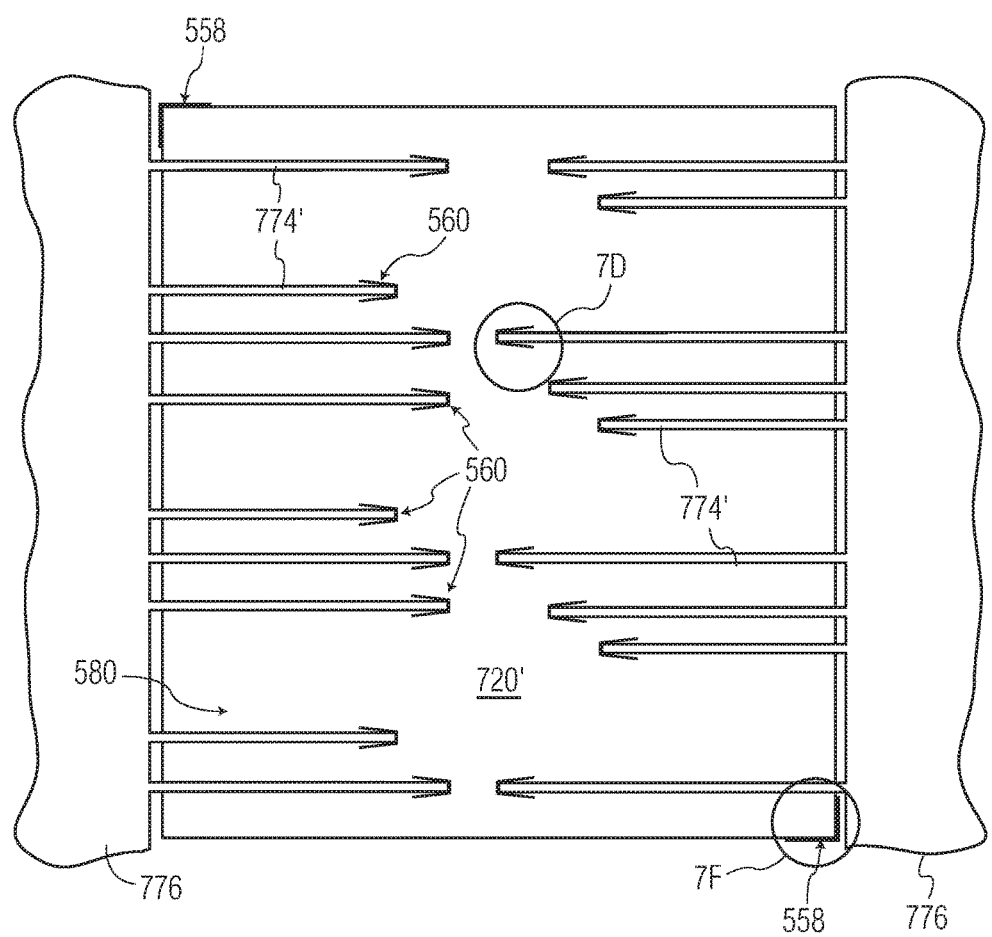
FIG. 7G is an overhead block diagram view of the graphical overlay of FIG. 7B with tooling elements of the material handling system now aligned with the graphical overlay in accordance with an exemplary embodiment of the present invention.

FIG. 7B illustrates a portion of a subject MHS having portions of the tooling element (e.g., anvil 720, and clamping fingers 774 of device clamp 776) misaligned with respect to graphical overlay markings 558, 560 of overlay 580. Using graphical overlay 580 (or multiple layers 580a, 580b, 580c, 580d, as desired), the imaging system may image each desired clamping finger 774 on a display, where the corresponding portion of overlay 580, including the corresponding alignment marking 560, is superimposed within the image of the clamping finger 774. Thus, a user can look at the display and move each clamping finger 774, as necessary, so that it is aligned with its corresponding alignment marking 560. This results in aligned clamping finger 774' (e.g., see FIGS. 7D and 7G). More specifically, FIG. 7C (portion 7C of FIG. 7B) illustrates an exemplary clamping finger 774 that is misaligned with respect to alignment marking 560, and FIG. 7D (portion 7D of FIG. 7G) illustrates that exemplary clamping finger 774' repositioned to be aligned with alignment marking 560. This process may be repeated for each misaligned clamping finger 774. Likewise, this process may be repeated for misaligned anvil 770. More specifically, FIG. 7E (portion 7E of FIG. 7B) illustrates an anvil 770 that is misaligned with respect to alignment marking 558, and FIG. 7F (portion 7F of FIG. 7G) illustrates anvil 770' repositioned to be aligned with alignment marking 558. The alignment of clamping fingers 774 and anvil 770 may occur in any order, as desired. FIG. 7G illustrates the tooling element having its respective portions now aligned in accordance with overlay 580.

As noted above, the process of adjusting the portions of the tooling element may be a manual process by which the user positions the imaging system to view each portion of the tooling element (along with the corresponding alignment marking) in succession. However, the process may be enhanced such that the imaging system automatically proceeds from one alignment marking to the next alignment marking upon a predetermined condition being met. For example, the predetermined condition may be a keystroke, button, etc. by which the user indicates that he/she is ready to view the next alignment marking (presumably along with the corresponding portion of the tooling element).

Figure 7H:
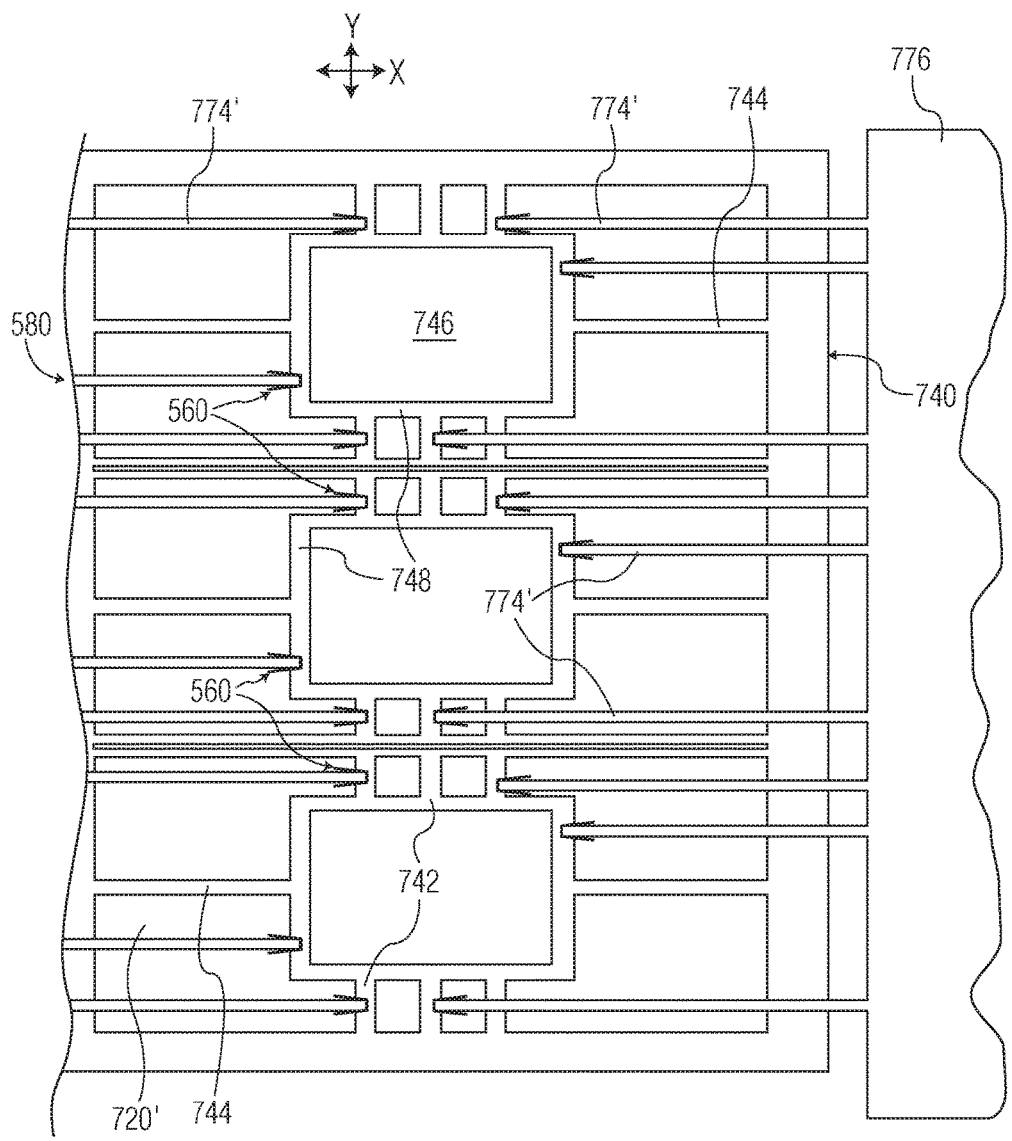
FIG. 7H is an overhead block diagram view of FIG. 7G now including a leadframe in accordance with an exemplary embodiment of the present invention.

Following the alignment process illustrated and described above with respect to FIGS. 7A-7G, the user may then index a workpiece to a bonding position on the subject MHS in order to confirm that the tooling element (including the clamping fingers and/or the anvil) is properly positioned with respect to the workpiece. FIG. 7H illustrates a workpiece (i.e., leadframe 740) indexed into a bonding position. Leadframe 740 is generally aligned with the tooling element (e.g., aligned clamping fingers 774') as desired; however, if leadframe 740 is not properly aligned, adjustments may be made. For example, the leadframe indexing may be adjusted (e.g., along the x-axis, and possibly along the y-axis). Such adjustments may be made in software or hardware. Further, a portion of the tooling element may also be adjusted as desired (e.g., in connection with an adjusted alignment marking/overlay). For example, the user may adjust the positions of aligned anvil 720', and aligned clamping fingers 774', as desired to adjust the alignment with leadframe 740. The user may then use the software to edit (and save) the overlay (e.g., unitary overlay 580, or layers 580a, 580b, 580c, 580d comprising overlay 580) and/or the reference locations of overlay 580 to correspond to the adjusted anvil and clamping fingers positions.

Figure 8:
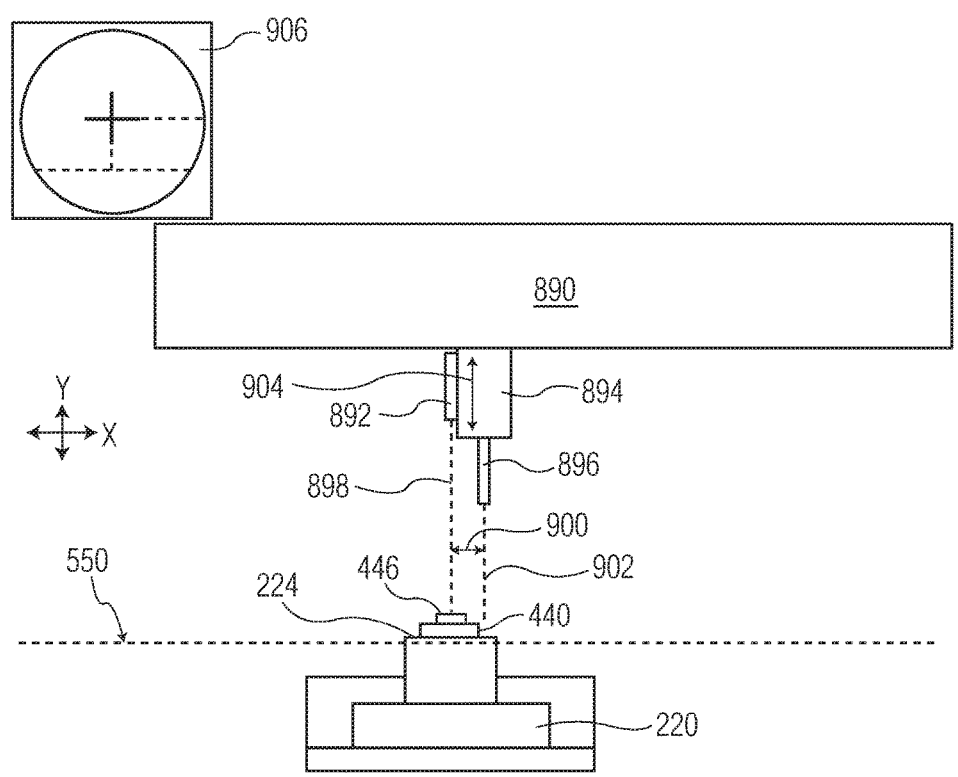
FIG. 8 is a side block diagram view of various elements of an ultrasonic bonding system useful for explaining various exemplary embodiments of the present invention.

FIG. 8 illustrates support structure 220 (e.g., anvil 220 with face 224) supporting workpiece 440 (e.g., leadframe 440 with die 446 supported by face 224). Other elements of the ultrasonic bonding system shown in FIG. 8 include XY table 890 carrying bond head 894, which in turn carries bonding tool 896 and optical system 892. Of course, other configurations (e.g., a configuration where optical system 892 can change the focus height setting independent of movement of the bond head) are contemplated. Optical system 892 defines optical axis 898, where optical axis 898 is offset from bonding tool axis 902 by offset 900. Anvil 220 is raised above rail lip plane 550 and supports die 446 (the device clamp is omitted for simplicity). Optical system 892 may focus upon different portions of the tooling element (where the portions may be arranged at different heights) by changing a focus height setting. This may be accomplished by the z-axis movement of optical system 892 (in this case carried by bond head 894) as shown by double headed arrow 904. Images from optical system 892 (e.g., including a camera) are displayed on display device 906 for viewing by the user, for example, during setup of the reference tooling element (including generation of the overlay) and during use of the overlay with respect to a subject tooling element to be aligned.

In summary, the Graphical Tooling Setup Software (GTS) of the present invention uses an imaging capture system installed on a wire or ribbon bonder to create an image of the material handling system (MHS) on a bonder. A graphical representation, or template, (e.g., graphical overlay 580) is then provided (e.g., superimposed) on this MHS image to allow for alignment of various elements of the tooling element to this graphical representation. The graphical representation is located relative to distinguishing features on a workpiece (e.g., a leadframe) or MHS to allow for portability of the graphical template to multiple bonders/locations.

Although the present invention has been described primarily in terms of bonding systems and workholders for bonding wire of ribbon material between die and leads, it is not limited thereto. The teachings of the present invention have application in any of a number of ultrasonic bonding applications (e.g., ribbon bonding, wire bonding, etc.) to any of a number of types of workpieces (not limited to leadframes).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic bonder comprising:
a support structure configured to support a workpiece during an ultrasonic bonding operation;
a clamp finger for securing a portion of the workpiece against the support structure during the ultrasonic bonding operation;
an imaging system; and
an overlay configured to be imaged by the imaging system in relation to at least one of the support structure and the clamp finger,
wherein the overlay is configured to assist in the alignment of at least one of the support structure and the clamp finger in connection with a position of the support structure or the clamp finger included in the overlay,
wherein the overlay defines a relative position of at least a portion of at least one of (i) the clamp finger with respect to at least one reference position of a reference material handling system and (ii) the support structure with respect to at least one reference position of a reference material handling system.

2. The ultrasonic bonder of claim 1 wherein the overlay includes a computerized overlay configured to be viewed on a display of the ultrasonic bonder.

3. The ultrasonic bonder of claim 1 wherein the overlay is configured to be imaged by the imaging system in relation to the support structure.

4. The ultrasonic bonder of claim 1 wherein the overlay is configured to be imaged by the imaging system in relation to the clamp finger.

5. The ultrasonic bonder of claim 1 wherein the overlay defines a relative position of at least a portion of the clamp finger with respect to the at least one reference position of the reference material handling system.

6. The ultrasonic bonder of claim 5 wherein the at least one reference position is a position of at least one of (1) a portion of a rail member of the reference material handling system, and (2) a portion of a riser member of the reference material handling system configured for raising a workpiece in connection with an ultrasonic bonding operation.

7. The ultrasonic bonder of claim 1 wherein the overlay defines the relative position of the at least a portion of the clamp figure with respect to the at least one reference position of the workpiece positioned by a material handling system of the ultrasonic bonder.

8. The ultrasonic bonder of claim 1 wherein the overlay defines the relative position of the at least a portion of the clamp finger with respect to the at least one reference position of a leadframe positioned by the material handling system of the ultrasonic bonding system.

9. The ultrasonic bonder of claim 1 wherein the overlay defines the relative position of the at least a portion of the support structure with respect to the at least one reference position of the reference material handling system.

10. The ultrasonic bonder of claim 9 wherein the at least one reference position is a position of at least one of (1) a portion of a rail member of the reference material handling system, and (2) a portion of a riser member of the reference material handling system configured for raising a workpiece in connection with an ultrasonic bonding operation.

11. The ultrasonic bonder of claim 1 wherein the overlay defines the relative position of the at least a portion of the support structure with respect to the at least one reference position of the workpiece positioned by the material handling system of the ultrasonic bonder.

12. The ultrasonic bonder of claim 1 wherein the overlay defines the relative position of the at least a portion of the support structure with respect to the at least one reference position of a leadframe positioned by the material handling system of the ultrasonic bonding system.

13. The ultrasonic bonder of claim 1 further comprising a computer including memory, the overlay being stored in the memory.

14. The ultrasonic bonder of claim 1 further comprising a plurality of the clamp fingers for securing respective portions of the workpiece against the support structure during the ultrasonic bonding operation.

15. The ultrasonic bonder of claim 14 wherein the overlay defines a relative position of the plurality of clamping fingers.

16. The ultrasonic bonder of claim 15 wherein the overlay includes a plurality of position markings defining the relative position of the plurality of clamping fingers.

17. The ultrasonic bonder of claim 16 wherein the plurality of position markings include at least one of (1) cross-shaped markings and (2) outline markings of at least a portion of respective ones of the plurality of clamping fingers.

18. The ultrasonic bonder of claim 16 wherein the plurality of position markings includes tolerance markings wherein a portion of each of the clamping fingers is configured to be aligned within a range defined by at least one of the respective tolerance markings.

19. The ultrasonic bonder of claim 16 wherein the overlay includes a plurality of layers, wherein ones of the plurality of layers includes a plurality of position markings defining the relative position of at least two of the plurality of clamping fingers.

* * * * *